United States Patent
Kim et al.

(10) Patent No.: US 10,150,321 B2
(45) Date of Patent: Dec. 11, 2018

(54) BLANKET FOR PRINTING AND METHOD FOR MANUFACTURING SAME

(71) Applicant: LG CHEM, LTD., Seoul (KR)

(72) Inventors: Jooyeon Kim, Daejeon (KR); Boem Mo Koo, Daejeon (KR); Seung Heon Lee, Daejeon (KR); Ji Eun Myung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 11 days.

(21) Appl. No.: 15/033,024

(22) PCT Filed: Nov. 19, 2014

(86) PCT No.: PCT/KR2014/011126
§ 371 (c)(1),
(2) Date: Apr. 28, 2016

(87) PCT Pub. No.: WO2015/080424
PCT Pub. Date: Jun. 4, 2015

(65) Prior Publication Data
US 2016/0243873 A1 Aug. 25, 2016

(30) Foreign Application Priority Data

Nov. 29, 2013 (KR) .......... 10-2013-0147803

(51) Int. Cl.
*B41N 10/04* (2006.01)
*C23C 14/58* (2006.01)

(52) U.S. Cl.
CPC ........... *B41N 10/04* (2013.01); *C23C 14/58* (2013.01); *B41N 2210/04* (2013.01)

(58) Field of Classification Search
None
See application file for complete search history.

(56) References Cited

U.S. PATENT DOCUMENTS

| 3,795,568 | A | * | 3/1974 | Rhodarmer et al. ... | B41N 10/04 101/376 |
| 4,770,928 | A | | 9/1988 | Gaworowski | |
| 5,352,507 | A | * | 10/1994 | Bresson ................ | B41N 10/04 428/304.4 |
| 2003/0116044 | A1 | * | 6/2003 | Buono ................... | B41N 10/02 101/395 |
| 2004/0028432 | A1 | * | 2/2004 | Pickering ........... | G03G 15/2057 399/328 |
| 2006/0060095 | A1 | | 3/2006 | Iwasaki et al. | |
| 2012/0318154 | A1 | * | 12/2012 | Muraoka ................ | B41N 10/02 101/401.1 |

FOREIGN PATENT DOCUMENTS

| CN | 1717334 | 1/2006 |
| CN | 203032110 U | 7/2013 |
| JP | 2000343853 A | 12/2000 |
| JP | 2001328368 A | 11/2001 |
| JP | 2003305967 A | 10/2003 |
| KR | 1020080090890 A | 9/2008 |
| KR | 1020090003883 A | 1/2009 |

(Continued)

*Primary Examiner* — Joshua D Zimmerman
(74) *Attorney, Agent, or Firm* — Dentons US LLP (57) ABSTRACT

The present specification provides a blanket for printing and a method for manufacturing the same.

16 Claims, 4 Drawing Sheets

(56) References Cited

FOREIGN PATENT DOCUMENTS

| KR | 1020090020076 A | 2/2009 |
|----|-----------------|--------|
| KR | 1020100138529 A | 12/2010 |
| KR | 1020110004739 A | 1/2011 |
| KR | 1020110105738 A | 9/2011 |
| KR | 101251786 B1 | 4/2013 |

* cited by examiner

BLANKET FOR PRINTING AND METHOD FOR MANUFACTURING SAME

TECHNICAL FIELD

This application is a National Stan Application of International Application No. PCT/KR2014/011126, filed Nov. 19, 2014, and claims the benefit of Korean Patent Application No. 10-2013-0147803, filed Nov. 29, 2013, the contents of which are incorporated herein by reference in their entirety for all purposes as if fully set forth below.

The present specification relates to a blanket for printing and a method for manufacturing the same.

BACKGROUND ART

Electronic devices such as liquid crystal display devices and semiconductor devices are generally manufactured by forming numerous layers of patterns on a substrate. A photolithography process has been primarily used so far in order to form such patterns. However, a photolithography process has problems in that a prescribed pattern mask needs to be prepared, the manufacturing process is complicated since chemical etching and stripping processes need to be repeated, and chemical wastes harmful to the environment are produced in large quantities. This soon connects to a manufacturing cost increase and lowers product competitiveness. A roll printing method using a printing roll has been proposed as a new pattern-forming method in order to solve such disadvantages of a photolithography process.

The roll printing method includes various methods, but is largely divided into 2 methods of a gravure printing method and a reverse offset printing method.

A gravure printing method is a printing method of coating an ink on a copperplate, scraping the excess ink and then printing, and is known to be suitable for printing in various fields such as for publishing, for packaging, for cellophane, for vinyl and for polyethylene, and researches for applying the gravure printing method in preparing an active device or a circuit pattern used in display devices have been made. The gravure printing method transfers an ink on a substrate using a transfer roll, therefore, a pattern may be formed with one transfer even for a large area display device by using a transfer roll corresponding to a target area of the display device. Such a gravure printing method not only forms an ink pattern for a resist on a substrate, but also is used in patterning various patterns of a display device, in the case of a liquid crystal display device for example, patterning metal patterns for a TFT, and for a gate line and a data line, pixel electrode, a capacitor connected to the TFT as well.

However, a blanket commonly used in a gravure printing method is prepared by casting a silicone-based resin in a hard master mold, and the blanket prepared as above has a limit in being prepared to have a uniform thickness, and also has a difficulty in mass production on a pilot scale. Accordingly, a reverse offset printing method is normally employed for forming an accurate micro pattern.

A reverse offset printing method is a very popular technology in terms that costs are saved and a production rate is improved in forming a pattern, however, a high-quality blanket is required in order to obtain an accurate pattern. Moreover, a cushion layer included in a blanket has an advantage in widening a printing pressure margin, but has a problem in that a thickness variation of the blanket becomes large since a thickness variation of the cushion layer becomes large due to nonuniform foam particle sizes.

DETAILED DESCRIPTION OF THE INVENTION

Technical Problem

In view of the above, the inventors of the present invention provide a blanket for printing according to the present specification and a method for manufacturing the same.

Technical Solution

One embodiment of the present specification provides a blanket for printing including a support layer; a cushion layer provided on the support layer; and a surface printing layer provided on the cushion layer, wherein the cushion layer includes a first cushion layer provided on the support layer, and a second cushion layer provided on the first cushion layer, and 90% or greater of empty inside space of the whole cushion layer is distributed in the first cushion layer.

One embodiment of the present specification provides a blanket for printing including a first unit including a support layer and a cushion layer provided on the support layer; and a second unit including an additional support layer provided on the cushion layer, and a surface printing layer provided on the additional support layer, wherein the cushion layer includes a first cushion layer provided on the support layer and a second cushion layer provided on the first cushion layer, and 90% or greater of empty inside space of the whole cushion layer is distributed in the first cushion layer.

One embodiment of the present specification provides a method for manufacturing the blanket for printing including preparing a support layer; forming a first cushion layer on the support layer; forming a second cushion layer on the first cushion layer; and forming a surface printing layer on the second cushion layer.

One embodiment of the present specification provides a method for manufacturing the blanket for printing including preparing a support layer; forming a first cushion layer on the support layer; forming a first unit by forming a second cushion layer on the first cushion layer; preparing an additional support layer; forming a second unit by forming a surface printing layer on the additional support layer; and combining the first unit and the second unit.

Advantageous Effects

A blanket for printing according to one embodiment of the present specification includes a first cushion layer having large porosity thereby is capable of enlarging a printing pressure margin, and may minimize a surface variation of a blanket for printing despite including the first cushion layer by including a second cushion layer having almost no porosity. Accordingly, when printing is carried out using a blanket for printing according to one embodiment of the present specification, printing of an accurate pattern can be achieved.

In addition, in a blanket for printing according to one embodiment of the present specification, a first unit including a cushion layer and a second unit including a surface printing layer are each prepared on a different support layer and then combined, therefore, the second unit including a surface printing layer can be readily replaced, and there is an advantage in that replacement costs can be saved.

BEST MODE

Hereinafter, the present specification will be detailed in more detail.

One embodiment of the present specification provides a blanket for printing including a support layer; a cushion layer provided on the support layer; and a surface printing layer provided on the cushion layer, wherein the cushion layer includes a first cushion layer provided on the support layer and a second cushion layer provided on the first cushion layer, and 90% or greater of empty inside space of the whole cushion layer is distributed in the first cushion layer.

Figure 1:
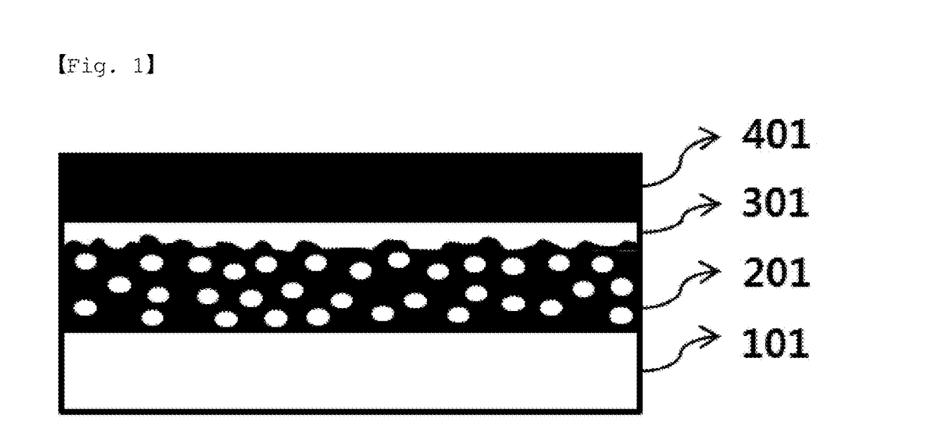
FIG. 1 and FIG. 2 are diagrams showing one example of a blanket for printing according to one embodiment of the present specification.

FIG. 1 is a diagram showing one example of a blanket for printing according to one embodiment of the present specification. Specifically, FIG. 1 is a diagram showing a blanket for printing in which a first cushion layer (201) and a second cushion layer (301) are provided on a support layer (101), and a surface printing layer (401) is provided on the second cushion layer (301).

In addition, one embodiment of the present specification provides a blanket for printing including a first unit including a support layer and a cushion layer provided on the support layer; and a second unit including an additional support layer provided on the cushion layer, and a surface printing layer provided on the additional support layer, wherein the cushion layer includes a first cushion layer provided on the support layer and a second cushion layer provided on the first cushion layer, and 90% or greater of empty inside space of the whole cushion layer is distributed in the first cushion layer.

In the blanket for printing according to one embodiment of the present specification, the first unit; and the second unit may be prepared separately and then combined.

Figure 2:
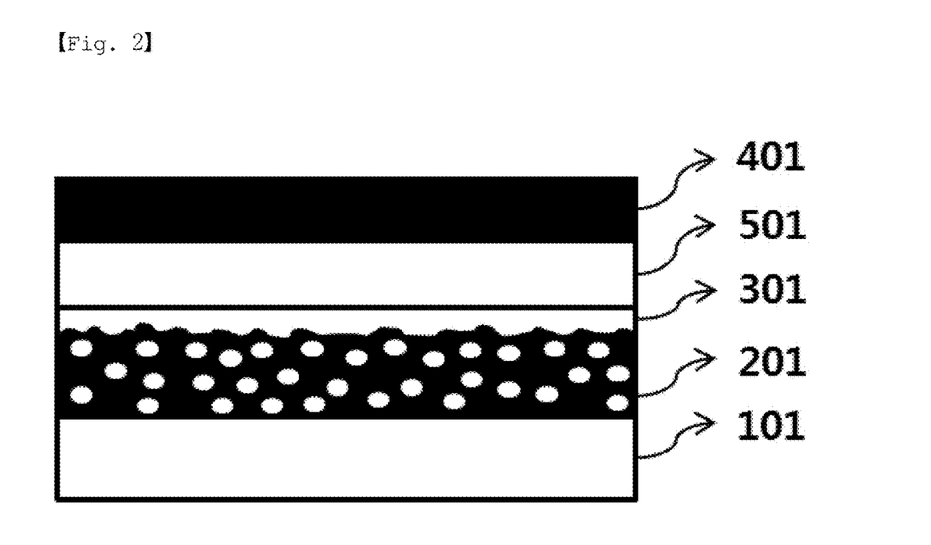

FIG. 2 is a diagram showing one example of a blanket for printing according to one embodiment of the present specification. Specifically, FIG. 2 is a diagram showing a blanket for printing in which a first cushion layer (201) and a second cushion layer (301) are provided on a support layer (101), an additional support layer (501) is provided on the second cushion layer (301), and a surface printing layer (401) is provided on the additional support layer (501).

Figure 3:
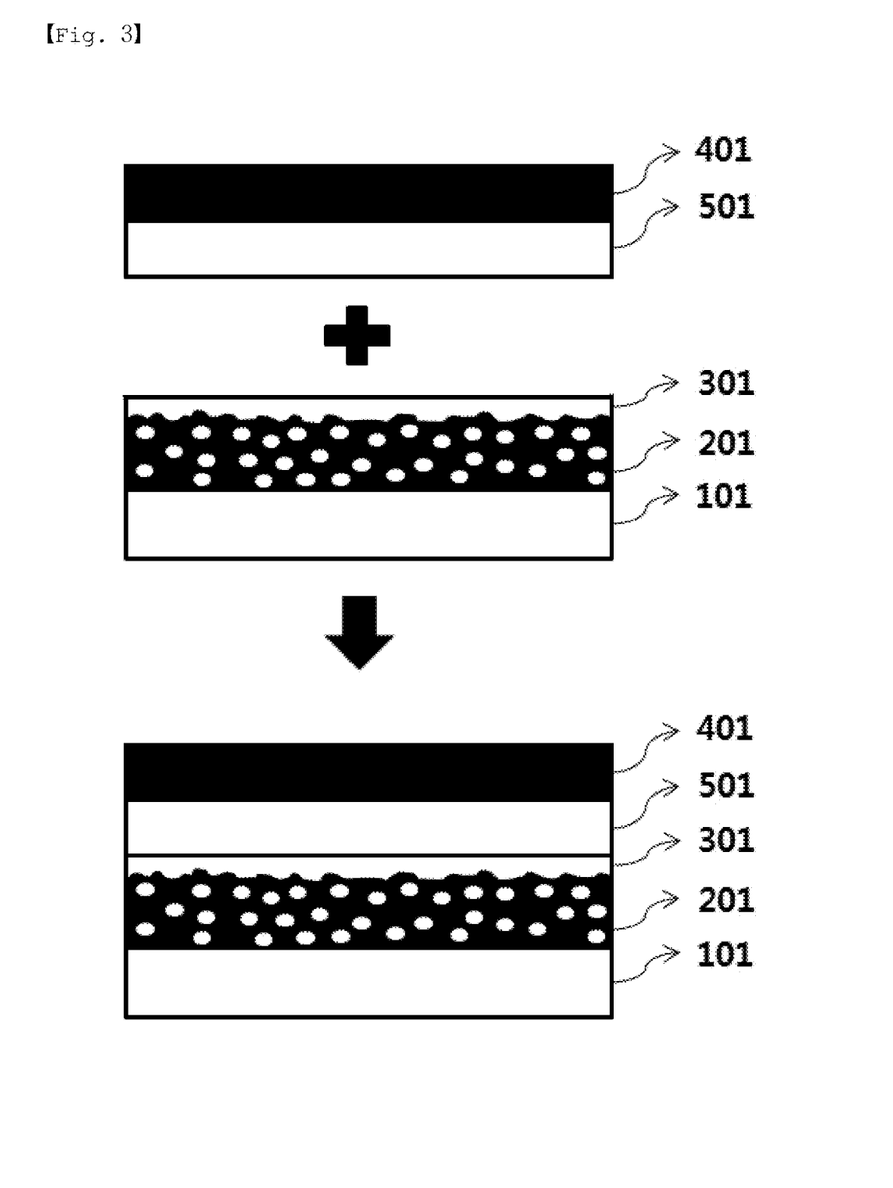
FIG. 3 is a diagram showing one example of manufacturing a blanket for printing according to one embodiment of the present specification.

FIG. 3 is a diagram showing one example of manufacturing a blanket for printing according to one embodiment of the present specification. Specifically, FIG. 3 is a diagram showing manufacturing a blanket for printing by preparing a first unit in which a first cushion layer (201) and a second cushion layer (301) are provided on a support layer (101), and separately preparing a second unit in which a surface printing layer (401) is provided on an additional support layer (501), and then combining the first unit and the second unit.

The empty inside space may mean an area formed with gases instead of materials forming a cushion layer inside the cushion layer. Specifically, the empty inside space may mean a porous area inside the cushion layer.

According to one embodiment of the present specification, the first cushion layer may play a role of expanding a printing pressure margin area of a blanket when printing by including empty inside space, and accordingly, may play a role of improving lifespan of a surface printing layer. Specifically, the first cushion layer may play a role of buffering a pressure generated when printing by including empty space inside so that the pressure generated when printing a blanket may be absorbed.

However, as described above, the first printing layer has an avoidable problem of a surface thickness variation due to empty inside space. Such a surface thickness variation has a great influence on the pattern of the surface of a surface printing layer leading to printing defects. In order to solve such a problem, the blanket for printing according to one embodiment of the present specification has a second cushion layer that does not practically include empty inside space provided on the first cushion layer, and therefore, a surface variation of the cushion layer hardly occurs, which leads to prevention of printing quality decline. In other words, the blanket for printing according to one embodiment of the present specification has an advantage of minimizing a thickness variation of the blanket for printing generated due to the first cushion layer by including the second cushion layer. Moreover, the blanket for printing according to one embodiment of the present specification has an advantage in that more accurate pattern printing may be carried out due to a low thickness variation of the cushion layer surface, and pattern defects may be minimized.

The surface printing layer of the blanket for printing needs to be replaced due to the decline of printing properties such as abrasion attributed to use, however, the cushion layer may be used semi-permanently, and does not have to be frequently replaced. In order to save this blanket replacement costs, the blanket for printing according to one embodiment of the present specification may be prepared by combining the first unit and the second unit. Specifically, in the blanket for printing according to one embodiment of the present specification, the second unit including a surface printing layer and the first unit including a cushion layer may be prepared separately on different supports and then combined, and in this case, only the second unit including a surface printing layer is readily replaced, and costs replacing a whole blanket may be saved.

In addition, when the cushion layer is separately prepared, the thickness variation of the cushion layer surface occurs by hollow microspheres or inside pores. In order to solve the above-mentioned problem, the blanket for printing according to one embodiment of the present specification forms the second cushion layer on the first cushion layer and may minimize the surface thickness variation of the cushion layer, and accordingly, surface nonuniformity of the surface printing layer may be minimized.

According to one embodiment of the present specification, the first cushion layer and the second cushion layer may be provided physically adjoining to each other.

According to one embodiment of the present specification, the surface thickness variation of a surface opposite to the second cushion layer surface adjoining the first cushion layer may be greater than or equal to 0 μm and less than or equal to 100 μm. Specifically, the surface thickness variation of a surface of the second cushion layer provided closest to the surface printing layer is greater than or equal to 0 μm and less than or equal to 100 μm.

Specifically, according to one embodiment of the present specification, the surface thickness variation of a surface opposite to the second cushion layer surface adjoining the first cushion layer may be greater than or equal to 0 μm and less than or equal to 50 μm.

According to one embodiment of the present specification, the surface thickness variation of the cushion layer may be the same as the surface thickness variation of the second cushion layer.

The surface thickness variation of the blanket for printing is dependent on the thickness variation of the second cushion layer surface. Specifically, when the second cushion layer is not provided, the thickness variation of the cushion layer surface becomes very large, and the surface thickness variation of the blanket for printing also becomes very large. In order to prevent such a problem, the blanket for printing of the present specification minimizes the surface thickness variation of the surface printing layer by providing the second cushion layer on the first cushion layer.

According to one embodiment of the present specification, the surface thickness variation of the blanket for printing may be greater than or equal to 0 μm and less than or equal to 100 μm. Specifically, the thickness variation of the blanket for printing may be greater than or equal to 0 μm and less than or equal to 50 μm.

The surface thickness variation of the blanket for printing may be a surface thickness variation of the surface printing layer. Specifically, the surface thickness variation of the surface printing layer may mean a surface thickness variation of each pattern unit and non-pattern unit of the surface printing layer.

The blanket for printing according to one embodiment of the present specification is capable of printing an accurate pattern due to a low thickness variation such as above. Specifically, when a pattern is formed using the blanket for printing according to one embodiment of the present specification, a micro pattern having a line width of greater than or equal to 1 μm and less than or equal to 5 μm may be printed.

According to one embodiment of the present specification, porosity of the first cushion layer may be greater than or equal to 5% and less than or equal to 50%.

According to one embodiment of the present specification, porosity of the second cushion layer may be greater than or equal to 0% and less than or equal to 5%. Specifically, the second cushion layer may have a dense structure having practically no empty inside space.

According to one embodiment of the present specification, empty inside space of the cushion layer may be a hollow microsphere or an inside pore.

Specifically, according to one embodiment of the present specification, the first cushion layer may be prepared to artificially form empty inside space. In addition, according to one embodiment of the present specification, the second cushion layer is prepared not to generate empty inside space, however, empty inside space may be partly formed during a manufacturing process. However, the second cushion layer may not practically include empty inside space.

According to one embodiment of the present specification, the first cushion layer may include a hollow microsphere or an inside pore.

As the hollow microspheres, those disclosed in U.S. Pat. No. 4,770,928 and the like may be used. Specifically, polymers including empty space inside may be used, and those having greater than or equal to 50% by volume and less than or equal to 95% by volume of the empty space in the whole hollow microsphere volume may be used. Particularly, when considering the prevention of cushion layer swelling caused by an ink, a hollow microsphere of which shell is formed with a single polymer of a polymeric monomer such as vinylidene chloride and (meth)acrylonitrile, or a copolymer including two or more types of these monomers are preferable. The particle diameter of the hollow microsphere is not particularly limited, however, the average particle diameter may be greater than or equal to 10 μm and less than or equal to 200 μm, or greater than or equal to 40 μm and less than or equal to 150 μm in order to favorably exhibit an effect of controlling printing pressure by the cushion layer.

The hollow microsphere may be mixed in a ratio of greater than or equal to 1 parts by weight and less than or equal to 30 parts by weight with respect to 100 parts by weight of the liquid silicone-based resin. When the mixing ratio of the hollow microsphere is less than the above-mentioned range, an effect of controlling printing pressure by the cushion layer is not exhibited. In addition, when the mixing ratio of the hollow microsphere is greater than the above-mentioned range, the cushion layer becomes soft, and printing accuracy declines. Furthermore, viscosity of the mixture is high and the mixture is not able to be uniformly applied to a target thickness.

The inside pore may be formed by foam particles. Specifically, foam particles may form pores as a liquid silicone-based resin including foam particles is cured. The size of the foam particles is not particularly limited, however, foam particles having a particle diameter of greater than or equal to 50 μm and less than or equal to 150 μm may be used in order to favorably exhibit the effect of controlling printing pressure. By adding such foam particles to the first cushion layer, a printing pressure margin area of the blanket, that is, a printing pressure range of uniform pattern printing may be further expanded when printing, and durability of the surface printing layer of the blanket may also be improved.

The foam particles may use those known in the art, and specifically, those that form pores by non-foam particles included in a silicone-based resin together with an organic solvent foaming through evaporation of the organic solvent by heat curing, or those in which foam particles already formed with pores are included in a silicone-based resin.

According to one embodiment of the present specification, the second cushion layer is provided in order to prevent printing quality decline caused by the generation of a large thickness variation of the first printing layer surface.

According to one embodiment of the present specification, the second cushion layer may include the same type of materials as the first printing layer. Specifically, according to one embodiment of the present specification, the second cushion layer may include the same material as the first printing layer, and more specifically, the second cushion layer may be prepared using the same materials as the first printing layer. Through this, interfacial adhesive strength between the thickness planarization layer and the printing layer may increase.

According to one embodiment of the present specification, the first cushion layer and the second cushion layer may each include a silicone-based resin.

According to one embodiment of the present specification, at least one of the first cushion layer and the second cushion layer may include silicone oil. Specifically, according to one embodiment of the present specification, the silicone oil may be included in greater than or equal to 1 parts by weight and less than or equal to 10 parts by weight with respect to 100 parts by weight of the silicone-based resin.

According to one embodiment of the present specification, Shore A hardness of the silicone-based resin may be greater than or equal to 20 and less than or equal to 40.

According to one embodiment of the present specification, Shore A hardness of the second cushion layer may be bigger than Shore A hardness of the first cushion layer by 5 to 15. Specifically, according to one embodiment of the present specification, Shore A hardness the second cushion layer may be bigger than Shore A hardness of the first cushion layer by 5 to 15, and Shore A hardness of the first cushion layer is greater than or equal to 20 and less than or equal to 30, and Shore A hardness of the second cushion layer is greater than or equal to 30 and less than or equal to 35.

The Shore A hardness is a general method of measuring rubber hardness and is in accordance with the JIS K 6301 (spring A type) standard, and test spring weight is from 539 to 8,379 mN.

Within the above range, silicone oil includes oil in space between chains of the silicone-based resin, and this is effective in preventing solvent penetration.

According to one embodiment of the present specification, the first cushion layer and the second cushion layer may include the same silicone-based resin.

According to one embodiment of the present specification, the silicone-based resin may be a polymer including silicone. Specifically, the silicone-based resin may exhibit heat-curable, room temperature-curable and catalyst-curable properties.

According to one embodiment of the present specification, the silicone-based resin may use those known in the art, and more specifically, may use polydimethylsiloxane acid (PDMS). Specifically, according to one embodiment of the present specification, the silicone-based resin may be PDMS.

According to one embodiment of the present specification, the thickness ratio of the first cushion layer and the second cushion layer may be from 2:1 to 3:1.

According to one embodiment of the present specification, the thickness of the first cushion layer may be greater than or equal to 200 μm and less than or equal to 2,800 μm. Specifically, the thickness of the first cushion layer may be greater than or equal to 400 μm and less than or equal to 2,000 μm. More specifically, the thickness of the first cushion layer may be greater than or equal to 1,000 μm and less than or equal to 1,500 μm.

The thickness of the first cushion layer may mean an average value of a distance from the lower surface to the upper surface of the first cushion layer.

When the thickness of the first cushion layer is within the above-mentioned range, the first cushion layer has an excellent printing pressure controlling effect, and plays a role of supporting each layer of the blanket for printing, and accordingly, excellent efficiency of the blanket for printing may be obtained. In other words, when the thickness of the first cushion layer is less than 200 μm, the printing pressure effect of the first cushion layer may not be sufficiently exhibited, and when greater than 2,800 μm, there may be a problem of reducing the effect of a relative thickness decrease compared to other layers.

According to one embodiment of the present specification, the thickness of the second cushion layer may be greater than or equal to 200 μm and less than or equal to 700 μm. Specifically, the thickness of the second cushion layer may be greater than or equal to 400 μm and less than or equal to 600 μm.

The thickness of the second cushion layer may mean an average value of a distance from the lower surface to the upper surface of the second cushion layer.

When the thickness of the second cushion layer is within the above-mentioned range, it is possible to have almost no surface thickness variation of the cushion layer by covering the surface thickness variation of the first cushion layer. Moreover, when the thickness of the second cushion layer is less than 200 μm, a surface step may be present in the cushion layer, and when the thickness of the second cushion layer is greater than 700 μm, a problem of a printing pressure margin decrease in the first cushion layer may occur.

The second cushion layer may play a role of relieving nip pressure of the cushion layer and distributing the pressure. Specifically, the second cushion layer may be formed with the same material as the material forming the surface printing layer, and may be formed with silicone rubber having PDMS as a base material.

According to one embodiment of the present specification, the thickness of the second cushion layer may be greater than or equal to 5% and less than or equal to 50% of the total thickness of the second unit. Specifically, when the thickness of the second cushion layer is greater than 50% of the total thickness of the second unit, the efficiency of the blanket for printing may decline, and when less than 5% of the total thickness of the second unit, the role of the second cushion layer may not be exhibited.

According to one embodiment of the present specification, the total thickness of the cushion layer may be greater than or equal to 400 μm and less than or equal to 3,000 μm. Specifically, the total thickness of the cushion layer may be greater than or equal to 1,000 μm and less than or equal to 2,000 μm. More specifically, the total thickness of the cushion layer may be greater than or equal to 1,500 μm and less than or equal to 1,900 μm.

The total thickness of the cushion layer may mean a total thickness of the first cushion layer and the second cushion layer.

According to one embodiment of the present specification, the support layer and the additional support layer may be each formed with a polymer or a metal plate. In addition, the support layer and the additional support layer may be a film having small elasticity in order to suppress elasticness of a layer adjoining thereto, and to improve printing accuracy. Specifically, a film of a resin having tensile modulus of 1,000 MPa or greater, particularly from 2,000 to 5,000 MPa at room temperature, may be used.

According to one embodiment of the present specification, the support layer and the additional support layer may be a relatively flexible film as one or more types each selected from the group consisting of polyethylene terephthalate (PET), polymethylmethacrylate (PMMA), polycarbonate (PC), polyethylene and polypropylene. In addition, flexible materials capable of being coiled around a roll without creases, for example, a copper plate, stainless steel (SUS) foil and the like, may also be used in addition to the thermoplastic films.

According to one embodiment of the present specification, the support layer and the additional support layer may be each formed with polyethylene terephthalate (PET), polymethylmethacrylate (PMMA), polycarbonate (PC), polyethylene, polypropylene, a copper plate or SUS foil.

According to one embodiment of the present specification, the support layer and the additional support layer may each include a material in which an urethane-based compound is coated on polyethylene terephthalate (PET). In the case of PET used as the support layer and the additional support layer, untreated general PET is sometimes plasma and corona treated and the like in order to enhance adhesive strength with a primer. However, the treatment is not permanent in its effect, and the surface treatment effect is not significant, therefore, PET coated with an urethane-based compound thereon may be used in the present invention.

In addition, when a silicone resin is heat cured, PET also experiences expansion at a temperature near a glass temperature (Tg), therefore, using PET having a high heat stability grade is more preferable than using general grade PET, if possible. Otherwise, general PET is sufficiently exposed at a high temperature to sufficiently remove thermal history prior to being used as the support layer in order to further increase dimensional and locational stability.

According to one embodiment of the present specification, the thickness of the support layer and the thickness of the additional support layer may be each greater than or equal to 100 μm and less than or equal to 400 μm.

According to one embodiment of the present specification, the surface printing layer may be used without limit as long as it is a surface printing layer used in the art.

Specifically, the material of the surface printing layer is not particularly limited, and the surface printing layer may be prepared using known materials. The thickness of the surface printing layer is not particularly limited, but may be greater than or equal to 0.2 mm and less than or equal to 1 mm, and may be greater than or equal to 0.4 mm and less than or equal to 0.7 mm. In order to form the surface printing layer having a thickness less than the above-mentioned range, the amount of the liquid silicone resin applied needs to be extremely small, therefore, there is a concern that a leveling property may be reduced, and uniformity of the surface printing layer thickness may be damaged. In addition, when the thickness is greater than the above-mentioned range, there is a concern that a sufficient effect of controlling printing pressure by the cushion layer may not be obtained.

According to one embodiment of the present specification, a primer layer may be further included between the support layer and the cushion layer. The primer layer may include a primer for silicone adhesion, and may provide excellent adhesive strength between the support layer and the cushion layer.

In addition, according to one embodiment of the present specification, a primer layer may be further included between the cushion layer and the additional support layer. The primer layer may include a primer for silicone adhesion, and may provide excellent adhesive strength between the additional support layer and the cushion layer.

Furthermore, according to one embodiment of the present specification, a primer layer may be further included between the additional support layer and the surface printing layer. The primer layer may include a primer for silicone adhesion, and may provide excellent adhesive strength between the additional support layer and the surface printing layer.

According to one embodiment of the present specification, a slip coating layer may be further included on the second cushion layer. The slip coating layer reduces stickiness of the second cushion layer and may play a role of enabling the additional support layer to be readily installed on the first unit. In addition, the slip coating layer is not sticky and has suitable surface roughness, therefore, facilitates the installation of the second unit.

According to one embodiment of the present specification, the slip coating layer may be formed by coating a slip coating liquid on the second cushion layer. The slip coating liquid may be prepared by mixing one or more selected from the group consisting of a silicone resin, silicone oil, siloxane of which end is substituted with hydrogen, and silica particles. The slip coating liquid may be coated using a meyer bar or a baker applicator.

According to one embodiment of the present specification, the thickness of the slip coating layer may be greater than or equal to 1 μm and less than or equal to 10 μm.

According to one embodiment of the present specification, the blanket for printing may be for offset printing.

One embodiment of the present specification provides a method for manufacturing the blanket for printing including preparing a support layer; forming a first cushion layer on the support layer; forming a second cushion layer on the first cushion layer; and forming a surface printing layer on the second cushion layer.

In addition, one embodiment of the present specification provides a method for manufacturing the blanket for printing including preparing a support layer; forming a first cushion layer on the support layer; forming a first unit by forming a second cushion layer on the first cushion layer; preparing an additional support layer; forming a second unit by forming a surface printing layer on the additional support layer; and combining the first unit and the second unit.

According to one embodiment of the present specification, the step of forming a first cushion layer may be applying a liquid silicone-based resin mixed with hollow microspheres or foam particles on the support layer.

According to one embodiment of the present specification, the step of forming a first cushion layer may be carried out using a gap coating method.

The gap coating method is a method using a comma-type blade, and is a method in which a fluid such as a silicone-based resin to coat is applied on the top of a blade progress direction, a blade is placed on a support layer to have a constant distance (gap), and coating having a constant and uniform thickness is carried out in a width direction of the progress direction on the support layer by moving the blade in a horizontal direction. When the gap coating method is used, coating is carried out in a constant gap, therefore, there is an advantage in that stable coating may be accomplished and reproducible results may be obtained.

According to one embodiment of the present specification, the step of forming a second cushion layer may be defoaming a liquid silicone-based resin, and applying the liquid silicone-based resin on the first cushion layer.

According to one embodiment of the present specification, the step of forming a first cushion layer and the step of forming a second cushion layer may be each carried out at room temperature.

According to one embodiment of the present specification, the step of forming a first cushion layer and the step of forming a second cushion layer may each further include curing by heating or UV.

In the present specification, the room temperature may mean a temperature of greater than or equal to 15° C. and less than or equal to 25° C.

MODE FOR INVENTION

Hereinafter, the present specification will be described in detail with reference to examples. However, examples according to the present specification may be modified to various other forms, and the scope of the present specification is not interpreted to be limited to examples described below. Examples in the present invention are provided in order to more completely describe the present specification for those having average knowledge in the art.

Example 1

After fixing a support layer by vacuum adsorption, a primer layer was coated and dried. In order to form a first cushion layer, foam particles (Expancel 920DET, manufactured by AkzoNobel) (0.58 parts by weight) were added to a liquid silicone-based resin (100 parts by weight) and uniformly dispersed thereto, and a curing agent (10 parts by weight) was further added thereto to form a first cushion layer forming mixture. The mixture was coated on the primer layer, the result was cured for approximately 2 days, and a first cushion layer having a thickness of 1,200 μm was prepared. After that, in order to form a second cushion layer, the same resin (100 parts by weight) with the liquid silicone-based resin for forming the first cushion layer was prepared, and a curing agent (10 parts by weight) was mixed thereto and then defoamed, and the result was coated on the first cushion layer, cured for 24 hours to form a second cushion layer having a thickness of 500 μm. Furthermore, a slip coating liquid was applied on the second cushion layer using a meyer bar, the result was dried for approximately 4 hours at room temperature to form a slip coating layer having a thickness of 5 μm.

Figure 4:
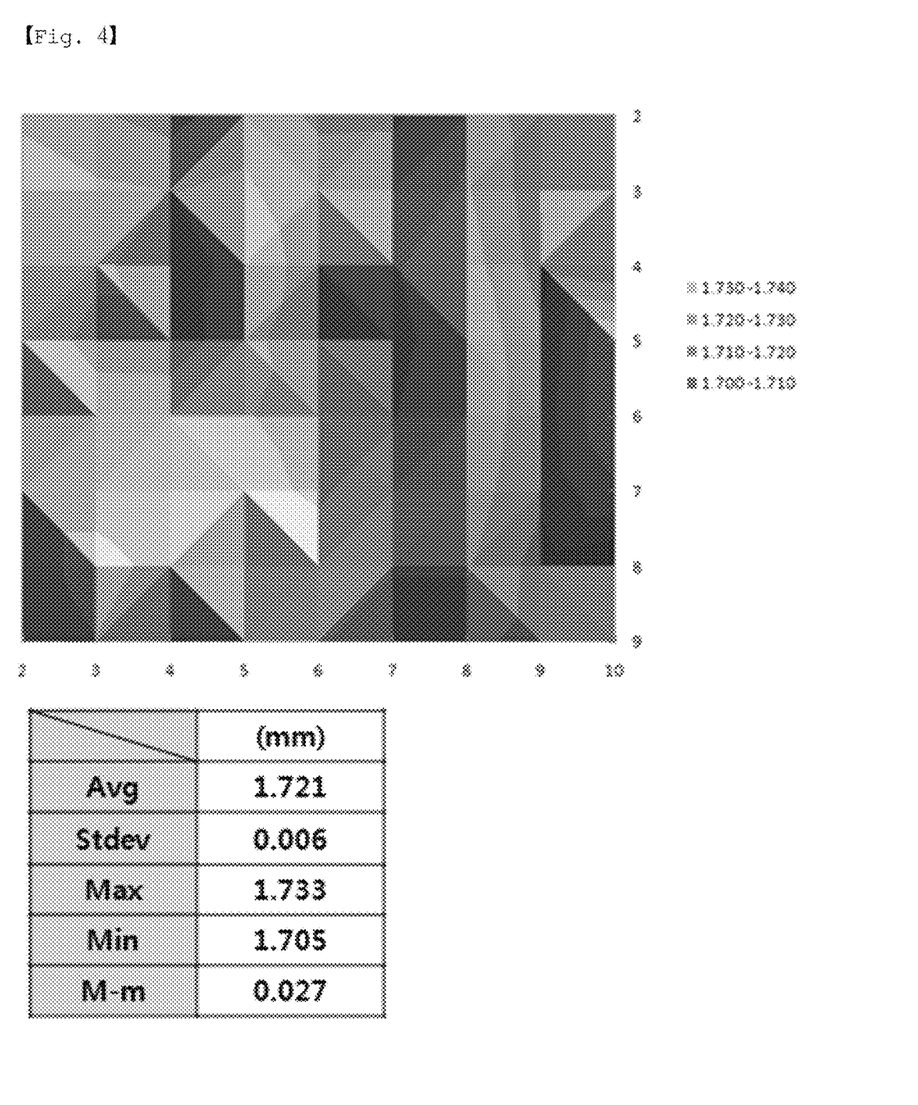
FIG. 4 shows a measurement result of a difference between a maximum value and a minimum value of a cushion layer surface having an area of 1,000 mm×1,600 mm including a first cushion layer and a second cushion layer prepared in Example 1.

FIG. 4 shows a measurement result of a thickness difference between a maximum value and a minimum value of the cushion layer surface having an area of 1,000 mm×1,600 mm including the first cushion layer and the second cushion layer prepared in Example 1.

Comparative Example 1

A cushion layer was prepared in the same manner as in Example 1 except that the second cushion layer was not included.

Figure 5:
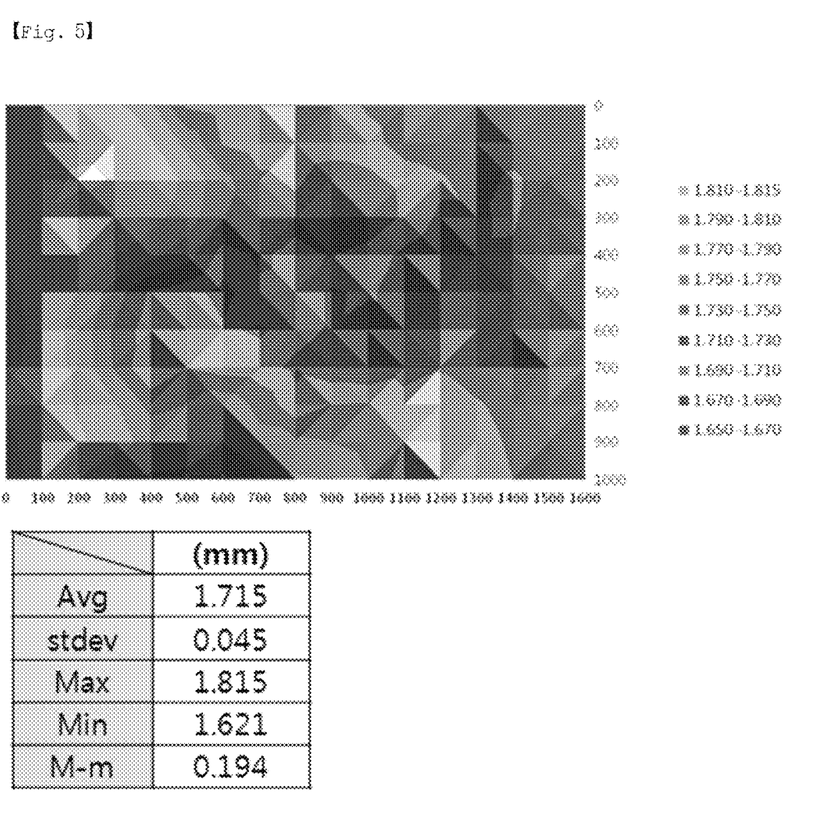
FIG. 5 shows a measurement result of a difference between a maximum value and a minimum value of a cushion layer surface having an area of 1,000 mm×1,600 mm prepared in Comparative Example 1.

FIG. 5 shows a measurement result of a thickness difference between a maximum value and a minimum value of the cushion layer surface having an area of 1,000 mm×1,600 mm prepared in Comparative Example 1.

When comparing FIG. 4 and FIG. 5, it can be seen that, in Comparative Example 1 that did not include the second cushion layer, the thickness difference between the maximum value and the minimum value of the cushion layer surface was approximately 200 μm, while the thickness difference between the maximum value and the minimum value in Example 1 that included the second cushion layer was only approximately 30 μm. A surface thickness variation of a blanket for printing is determined by a thickness variation of a cushion layer surface, therefore, it can be inferred that the blanket for printing according to one embodiment of the present specification is capable of printing more accurate patterns due to a small thickness variation.

DESCRIPTION OF REFERENCE NUMERALS

101: Support Layer
201: First Cushion Layer
301: Second Cushion Layer
401: Surface Printing Layer
501: Additional Support Layer

The invention claimed is:

1. A blanket for printing comprising:
a first unit including:
  a support layer including a film comprising a polyethylene terephthalate or a polymethylmethacrylate; and
  a cushion layer provided on the support layer, wherein the cushion layer comprises:
    a first cushion layer provided on the support layer, the first cushion layer comprising a silicone-based resin and foam particles having a particle diameter of greater than or equal to 50 μm and less than or equal to 150 μm, the first cushion layer having a porosity greater than or equal to 5% and less than or equal to 50%; and
    a second cushion layer having a porosity greater than or equal to 0% and less than or equal to 5% provided on the first cushion layer,
    wherein 90% or greater of empty inside space of the whole cushion layer is distributed in the first cushion layer; and
    wherein a surface thickness variation of a surface opposite to the second cushion layer surface adjoining the first cushion layer is greater than or equal to 0 μm and less than or equal to 100 μm; and
a second unit including:
  an additional support layer including a film comprising a polyethylene terephthalate or a polymethylmethacrylate provided on the second cushion layer of the first unit; and
  a surface printing layer provided on the additional support layer,
wherein the first unit and the second unit are separately prepared and then combined, and
wherein the first cushion layer and the second cushion layer are provided physically adjoining each other.

2. The blanket for printing of claim 1, wherein the second cushion layer includes a silicone-based resin.

3. The blanket for printing of claim 2, wherein at least one of the first cushion layer and the second cushion layer includes silicone oil.

4. The blanket for printing of claim 3, wherein the silicone oil is included in greater than or equal to 1 parts by weight and less than or equal to 10 parts by weight with respect to 100 parts by weight of the silicone-based resin.

5. The blanket for printing of claim 1, wherein Shore A hardness of the second cushion layer is bigger than Shore A hardness of the first cushion layer by 5 to 15.

6. The blanket for printing of claim 5, wherein Shore A hardness of the first cushion layer is greater than or equal to 20 and less than or equal to 30, and Shore A hardness of the second cushion layer is greater than or equal to 30 and less than or equal to 35.

7. The blanket for printing of claim 1, wherein a thickness ratio of the first cushion layer and the second cushion layer is from 2:1 to 3:1.

8. The blanket for printing of claim 1, wherein a thickness of the first cushion layer is greater than or equal to 200 μm and less than or equal to 2,800 μm, and a thickness of the second cushion layer is greater than or equal to 200 μm and less than or equal to 700 μm.

9. The blanket for printing of claim 1 further comprising a primer layer between the support layer and the cushion layer.

10. The blanket for printing of claim 1 further comprising a slip coating layer provided on the second cushion layer.

11. A method for manufacturing a blanket for printing comprising a first unit and a second unit, the method comprising:

preparing a first unit by:
    preparing a support layer including a film comprising a polyethylene terephthalate or a polymethylmethacrylate or a polyethylene terephthalate coated with a urethane-based compound;
    forming a first cushion layer on the support layer, the first cushion layer comprising a silicone-based resin and foam particles having a particle diameter of greater than or equal to 50 µm and less than or equal to 150 µm, the first cushion layer having a porosity greater than or equal to 5% and less than or equal to 50%; and;
    forming a second cushion layer on the first cushion layer, the second cushion layer having a porosity greater than or equal to 0% and less than or equal to 5% provided on the first cushion layer,
wherein 90% or greater of empty inside space of the whole cushion layer is distributed in the first cushion layer; and
wherein a surface thickness variation of a surface opposite to the second cushion layer surface adjoining the first cushion layer is greater than or equal to 0 and less than or equal to 100 µm;

forming a second unit by preparing an additional support layer including a film comprising a polyethylene terephthalate or a polymethylmethacrylate or a polyethylene terephthalate coated with a urethane-based compound and forming a surface printing layer on the additional support layer; and combining the first unit and the second unit to yield the blanket for printing, wherein the first unit and the second unit are separately prepared and then combined, and wherein the first cushion layer and the second cushion layer are provided physically adjoining each other.

12. The method for manufacturing the blanket for printing of claim 11, wherein the step of forming a first cushion layer is applying a liquid silicone-based resin mixed with foam particles on the first support layer.

13. The method for manufacturing the blanket for printing of claim 11, wherein the step of forming a first cushion layer is carried out using a gap coating method.

14. The method for manufacturing the blanket for printing of claim 11, wherein the step of forming a second cushion layer is defoaming a liquid silicone-based resin, and applying the liquid silicone-based resin on the first cushion layer.

15. The method for manufacturing the blanket for printing of claim 11, wherein the step of forming a first cushion layer and the step of forming a second cushion layer are each carried out at room temperature.

16. The method for manufacturing the blanket for printing of claim 11, wherein the step of forming a first cushion layer and the step of forming a second cushion layer each further include curing by heating or UV.

* * * * *